United States Patent
Venkatasubramanian et al.

(10) Patent No.: US 12,362,181 B2
(45) Date of Patent: Jul. 15, 2025

(54) METHODS OF FORMING THERMALLY STABLE CARBON FILM

(71) Applicant: Applied Materials, Inc., Santa Clara, CA (US)

(72) Inventors: Eswaranand Venkatasubramanian, Santa Clara, CA (US); Rajaram Narayanan, Santa Clara, CA (US); Pramit Manna, Santa Clara, CA (US); Abhijit B. Mallick, Fremont, CA (US); Karthik Janakiraman, San Jose, CA (US); Jialiang Wang, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 504 days.

(21) Appl. No.: 17/659,350

(22) Filed: Apr. 15, 2022

(65) Prior Publication Data
US 2023/0335402 A1    Oct. 19, 2023

(51) Int. Cl.
*H01L 21/311*    (2006.01)
*C23C 16/26*    (2006.01)
(Continued)

(52) U.S. Cl.
CPC .......... *H01L 21/0337* (2013.01); *C23C 16/26* (2013.01); *C23C 16/505* (2013.01);
(Continued)

(58) Field of Classification Search
CPC ............. H01L 21/0337; H01L 21/0332; H01L 21/31144; H01L 21/02115; H01L 21/02274; H01L 21/31116; H01L 21/02318; H01L 21/0262; H01L 21/02337; H01L 31/03682; H01L 31/1812; H01L 21/6831; H01L 21/3065; C23C 16/26;
(Continued)

(56) References Cited

U.S. PATENT DOCUMENTS

| | | |
|---|---|---|
| 11,043,372 B2 | 6/2021 | Venkatasubramanian et al. |
| 11,043,375 B2 | 6/2021 | Yang et al. |

(Continued)

OTHER PUBLICATIONS

International Search Report and Written Opinion for Application No. PCT/US2023/018005 dated Aug. 1, 2023.

*Primary Examiner* — Niki H Nguyen
(74) *Attorney, Agent, or Firm* — Patterson + Sheridan, LLP (57) ABSTRACT

A method of processing a substrate is provided including flowing a deposition gas comprising a hydrocarbon compound and a dopant compound into a process volume having a substrate disposed positioned on a substrate support. The process volume is maintained at a pressure of about 0.5 mTorr to about 10 mTorr. The method includes generating a plasma at the substrate by applying a first RF bias to the substrate support to deposit a doped diamond-like carbon film on the substrate. The doped diamond-like carbon film includes about 5 at. % to about 25 at. % of dopant and a first stress property. The method includes annealing the doped diamond-like carbon film at about 220° C. to about 450° C. to form an annealed film. The annealed film includes a second stress property. The second stress property having an absolute value less than or within 10% the first stress property.

20 Claims, 5 Drawing Sheets

(51) Int. Cl.
  *C23C 16/505* (2006.01)
  *C23C 16/56* (2006.01)
  *H01J 37/32* (2006.01)
  *H01L 21/033* (2006.01)

(52) U.S. Cl.
  CPC ........ *C23C 16/56* (2013.01); *H01J 37/32357* (2013.01); *H01J 37/32449* (2013.01); *H01L 21/0332* (2013.01); *H01L 21/31144* (2013.01); *H01J 2237/3321* (2013.01)

(58) Field of Classification Search
  CPC ......... C23C 16/56; C23C 16/50; C23C 16/22; C23C 16/276; C23C 16/505; H01J 37/32357; H01J 37/32449; H01J 2237/3321; C01B 32/25; H10K 59/8731; H10K 71/00; H10K 50/8445; H10K 71/13
  See application file for complete search history.

(56) References Cited

U.S. PATENT DOCUMENTS

| | | |
|---|---|---|
| 2009/0029067 A1 | 1/2009 | Sciamanna et al. |
| 2018/0274089 A1 | 9/2018 | Yang et al. |
| 2018/0358222 A1 | 12/2018 | Venkatasubramanian et al. |
| 2020/0370177 A1 | 11/2020 | Franklin et al. |
| 2021/0404801 A1 | 12/2021 | Doi et al. |
| 2021/0407791 A1* | 12/2021 | Hsu .................. H01L 21/0337 |
| 2021/0407801 A1* | 12/2021 | Venkatasubramanian .................. C23C 16/272 |
| 2021/0407802 A1* | 12/2021 | Hsu .................. H01L 21/0337 |

* cited by examiner

METHODS OF FORMING THERMALLY STABLE CARBON FILM

BACKGROUND

Field

Embodiments of the present disclosure generally relate to methods used in the manufacture of semiconductor devices. More particularly, embodiments of the present disclosure relate to a method of doping and annealing of carbon films to form thermally stable diamond like carbon films.

Description of the Related Art

Integrated circuits have evolved into complex devices that can include millions of transistors, capacitors and resistors on a single chip. The evolution of chip designs continually involves faster circuitry and greater circuit density. The demands for faster circuits with greater circuit densities impose corresponding demands on the materials used to fabricate such integrated circuits. In particular, as the dimensions of integrated circuit components are reduced to the sub-micron scale, there is a trend to use low resistivity conductive materials as well as low dielectric constant insulating materials to obtain suitable electrical performance from such components.

The demands for greater integrated circuit densities also impose demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer.

As the pattern dimensions are reduced, the thickness of the energy sensitive resist is correspondingly reduced in order to control pattern resolution. Such thin resist layers can be insufficient to mask underlying material layers during the pattern transfer process due to attack by the chemical etchant. An intermediate layer (e.g., silicon oxynitride, silicon carbine or carbon film), called a hardmask, is often used between the energy sensitive resist layer and the underlying material layers to facilitate pattern transfer because of greater resistance to the chemical etchant. Hardmask materials having both high etch selectivity and high deposition rates are often utilized. As critical dimensions (CD) decrease, current hardmask materials lack the desired etch selectivity relative to underlying materials (e.g., oxides and nitrides) and are often difficult to deposit.

Therefore, there is a need in the art for an improved hardmask layers and methods for depositing improved hardmask layers.

SUMMARY

A method of processing a substrate is provided. The method includes flowing a deposition gas comprising a hydrocarbon compound and a dopant compound into a process volume of a process chamber. The process volume having a substrate disposed therein and positioned on a substrate support. The process volume is maintained at a pressure of about 0.5 mTorr to about 10 mTorr. The method further includes generating a plasma at the substrate by applying a first RF bias to the substrate support to deposit a doped diamond-like carbon film on the substrate. The doped diamond-like carbon film includes about 5 at. % to about 25 at. % of dopant. The doped diamond-like carbon film includes a first stress property. The method includes annealing the doped diamond-like carbon film at about 220° C. to about 450° C. to form an annealed film. The annealed film includes a second stress property. The second stress property having an absolute value less than or within 10% the first stress property.

A method of processing a substrate is provided. The method includes flowing a deposition gas. The deposition gas includes a hydrocarbon compound and a dopant compound including silicon into a process volume of a process chamber. The process volume includes a substrate disposed therein and positioned on a substrate support. The substrate support has a chucking electrode and an RF electrode separate from the chucking electrode. The process volume is maintained at a pressure of about 0.5 mTorr to about 10 Torr. The method includes generating a plasma at the substrate by applying a first RF bias to the RF electrode and a second RF bias to the chucking electrode to deposit a doped diamond-like carbon film on the substrate. The doped diamond-like carbon film has a density of greater than 2 g/cc to about 12 g/cc and a first stress of about −300 MPa to about −150 MPa. The method includes annealing the doped diamond-like carbon film at a temperature at about 220° C. to about 450° C. to form an annealed film, the annealed film having a second stress of about −250 MPa to about −100 MPa.

A method of processing a substrate is provided. The method includes positioning the substrate on a substrate support in a process volume. The method includes generating plasma above the substrate by applying an RF bias to the substrate support. The method includes providing a deposition gas comprising a hydrocarbon compound and a dopant compound comprising boron or silicon into a process volume of a process chamber. The substrate support has a chucking electrode and an RF electrode separate from the chucking electrode. The process volume is maintained at a pressure of about 0.5 mTorr to about 10 Torr. The method further includes generating a plasma at the substrate by applying a first RF bias to the RF electrode and a second RF bias to the chucking electrode to deposit a doped diamond-like carbon film on the substrate. The doped diamond-like carbon film has a density of greater than 2 g/cc to about 12 g/cc and a stress of about −600 MPa to about −300 MPa. The method includes annealing the doped diamond-like carbon film at a temperature at about 220° C. to about 450° C. to form an annealed film. The annealed film has a second stress of about −250 MPa to about −100 MPa. The method includes forming a patterned photoresist layer over the annealed film. The method includes etching the annealed film in a pattern corresponding with the patterned photoresist layer. The method further includes etching the pattern into the substrate.

BRIEF DESCRIPTION OF THE DRAWINGS

So that the manner in which the above recited features of the present disclosure can be understood in detail, a more particular description of the disclosure, briefly summarized above, is had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment is beneficially incorporated in other embodiments without further recitation.

DETAILED DESCRIPTION

Embodiments of the present disclosure relate to forming high density carbon hardmasks capable of withstanding elevated temperatures that are part of substrate processing, such as temperature greater than 300 Celsius. Conventional hardmasks that are subjected to elevated temperatures typically change stress and become more compressive resulting in bowing and warping. These defects present challenges during subsequent lithography processes. It has been discovered that the high density carbon hardmasks doped with either silicon or boron dopants disclosed herein improve thermal stability of the hardmask. The high density carbon hardmasks described herein are formed using plasma enhanced chemical vapor deposition (PECVD) chambers.

Figure 1:
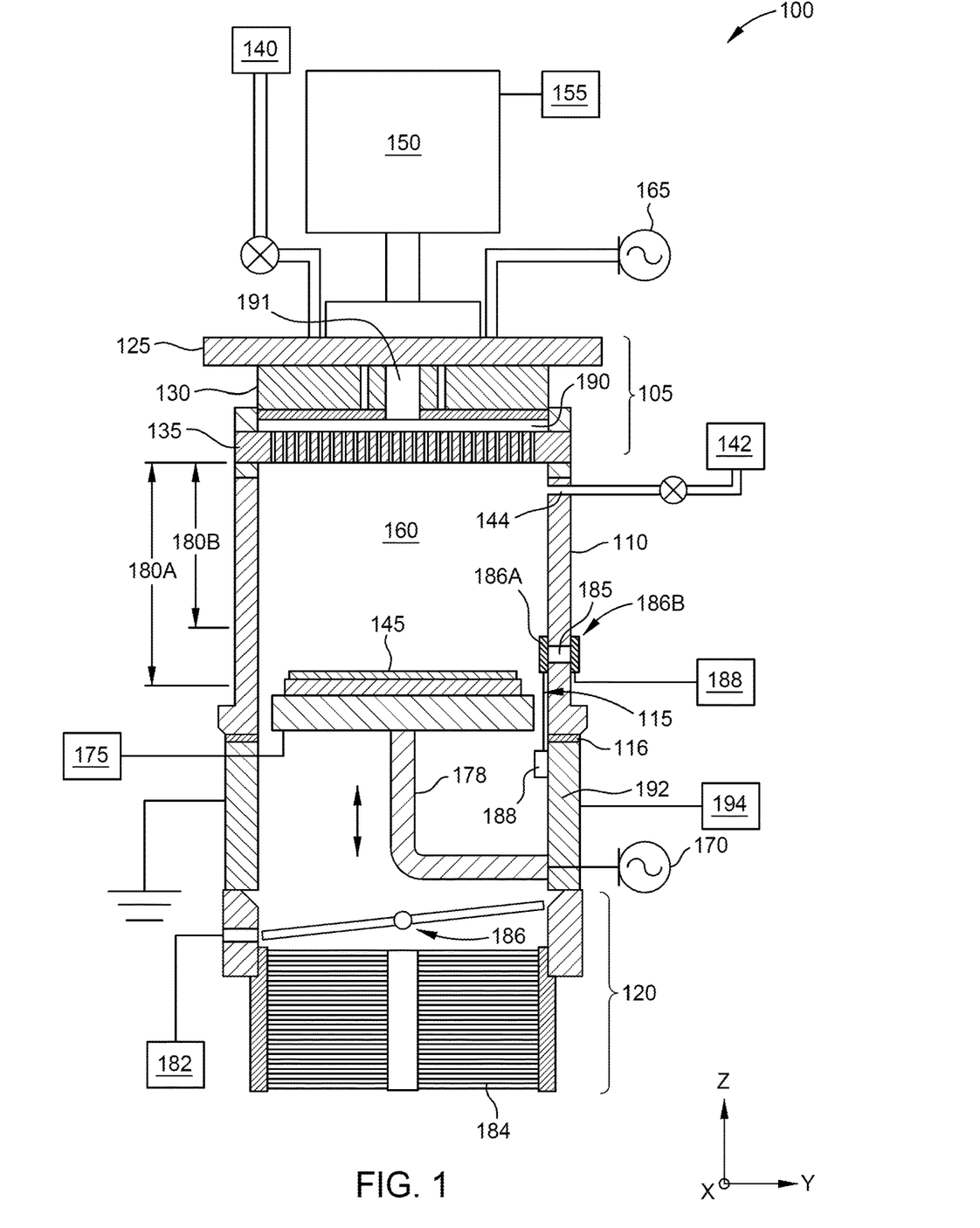
FIG. 1 is a schematic side cross sectional view of an illustrative process chamber according to an embodiment.

FIG. 1 is a schematic side cross sectional view of an illustrative process chamber 100 suitable for conducting a deposition process. Although FIG. 1 depicts one chamber suitable for conducting the deposition process described herein, other chambers are also contemplated. In one embodiment, which can be combined with other embodiments described herein, the process chamber 100 is configured to deposit advanced patterning films onto a substrate, such as hardmask films, for example amorphous carbon hardmask films.

The process chamber 100 includes a lid assembly 105, a spacer 194 disposed on a chamber body 192, a substrate support 115, and a variable pressure system 120. The lid assembly 105 includes a lid plate 125 and a heat exchanger 130. In the embodiment shown, which can be combined with other embodiments described herein, the lid assembly 105 also includes a showerhead 135.

The lid assembly 105 is coupled to a first processing gas source 140. The first processing gas source 140 contains precursor gases for forming films on a substrate 145 supported on the substrate support 115. As an example, the first processing gas source 140 includes precursor gases such as carbon containing gases, hydrogen containing gases, helium, among others. In a specific example, the carbon containing gas includes acetylene ($C_2H_2$). The first processing gas source 140 provides precursors gases to a plenum 190 disposed in the lid assembly 105. The lid assembly includes one or more channels for directing precursor gases from the first processing gas source 140 into the plenum 190. From the plenum, the precursor gases flow through the showerhead 135 into a process volume 160. In some embodiments, which can be combined with other embodiments described herein, a second processing gas source 142 is fluidly coupled to the process volume 160 via an inlet 144 disposed through the spacer 194. As an example, the second processing gas source 142 includes precursor gases such as carbon containing gases, hydrogen containing gases, helium, among others, for example $C_2H_2$. In one embodiment, which can be combined with other embodiments described herein, a total flow rate of precursor gases into the process volume 160 is about 100 sccm to about 2 slm. The flow of precursor gases in the process volume 160 via the second processing gas source 142 modulates the flow of precursor gases flow through the showerhead 135 such that the precursor gases are uniformly distributed in the process volume 160. In one example, a plurality of inlets 144 is radially distributed about the spacer 194. In such an example, gas flow to each of the inlets 144 is separately controlled to further facilitate gas uniformity within the process volume 160.

The lid assembly 105 is also coupled to an optional remote plasma source 150. The remote plasma source 150 is coupled to a cleaning gas source 155 for providing cleaning gases to the process volume 160 formed inside the spacer 194 between the lid assembly 105 and the substrate 145. In one example, cleaning gases are provided through a central conduit 191 formed axially through the lid assembly 105. In another example, cleaning gases are provided through the same channels which direct precursor gases. Example cleaning gases include oxygen-containing gases such as oxygen and/or ozone, as well fluorine containing gases such as NF3, or combinations thereof.

In addition to or as an alternative to the remote plasma source 150, the lid assembly 105 is also coupled to a first or upper radio frequency (RF) power source 165. The first RF power source 165 facilitates maintenance or generation of plasma, such as a plasma generated from a cleaning gas. In one example, the remote plasma source 150 is omitted, and the cleaning gas is ionized into a plasma in situ via the first RF power source 165. The substrate support 115 is coupled to a second or lower RF power source 170. The first RF power source 165 is a high frequency RF power source (for example, about 13.56 MHz to about 120 MHz) and the second RF power source 170 is a low frequency RF power source (for example, about 2 MHz to about 13.56 MHz). It is to be noted that other frequencies are also contemplated. In some implementations, the second RF power source 170 is a mixed frequency RF power source, providing both high frequency and low frequency power. Utilization of a dual frequency RF power source, particularly for the second RF power source 170, improves film deposition. In one example, utilizing a second RF power source 170 provides dual frequency powers. A first frequency of about 2 MHz to about 13.56 MHz improves implantation of species into the deposited film, while a second frequency of about 13.56 MHz to about 120 MHz increases ionization and deposition rate of the film. Without being bound by theory, it is believed that low frequency, such as the frequency of the first frequency enables ion energy control and high frequency, such as the second frequency can be used for ion density control.

One or both of the first RF power source 165 and the second RF power source 170 are utilized in creating or maintaining a plasma in the process volume 160. For example, the second RF power source 170 is utilized during a deposition process and the first RF power source 165 is utilized during a cleaning process (alone or in conjunction with the remote plasma source 150). In some deposition processes, the first RF power source 165 is used in conjunction with the second RF power source 170. During a deposition or etch process, one or both of the first RF power source 165 and the second RF power source 170 provide a power of about 100 Watts (W) to about 20,000 W in the process volume 160 to facilitation ionization of a precursor gas. In one embodiment, which can be combined with other embodiments described herein, at least one of the first RF power source 165 and the second RF power source 170 are pulsed. In another embodiment, which can be combined with other embodiments described herein, the precursor gas includes helium and $C_2H_2$. In one embodiment, which can be combined with other embodiments described herein, $C_2H_2$ is provided at a flow rate of about 10 sccm to about 1,000 sccm and He is provided at a flow rate of about 50 sccm to about 10,000 sccm.

The substrate support 115 is coupled to an actuator 175 (i.e., a lift actuator) that provides movement thereof in the Z direction. The substrate support 115 is also coupled to a facilities cable 178 that is flexible which allows vertical movement of the substrate support 115 while maintaining communication with the second RF power source 170 as well as other power and fluid connections. The spacer 194 is disposed on the chamber body 192. A height of the spacer 194 allows movement of the substrate support 115 vertically within the process volume 160. The height of the spacer 194 is about 0.5 inches to about 20 inches. In one example, the substrate support 115 is movable from a first distance 180A to a second distance 180B relative to the lid assembly 105 (for example, relative to a lower surface of the showerhead 135). In one embodiment, the second distance 180B is about ⅔ of the first distance 180A. For example, the difference between the first distance 180A and the second distance is about 5 inches to about 6 inches. Thus, from the position shown in FIG. 1, the substrate support 115 is movable by about 5 inches to about 6 inches relative to a lower surface of the showerhead 135. In another example, the substrate support 115 is fixed at one of the first distance 180A and the second distance 180B. In contrast to conventional plasma enhanced chemical vapor deposition (PECVD) processes, the spacer 194 greatly increases the distance between (and thus the volume between) the substrate support 115 and the lid assembly 105. The increased distance between the substrate support 115 and the lid assembly 105 reduces collisions of ionized species in the volume process volume 160, resulting in deposition of film with less neutral stress, such as less than 2.5 gigapascal (GPa). Films deposited with less neutral stress facilitate improved planarity (e.g., less bowing) of substrates upon which the film is formed. Reduced bowing of substrates results in improved precision of downstream patterning operations.

The variable pressure system 120 includes a first pump 182 and a second pump 184. The first pump 182 is a roughing pump that is utilized during a cleaning process and/or substrate transfer process. A roughing pump is generally configured for moving higher volumetric flow rates and/or operating a relatively higher (though still sub-atmospheric) pressure. In one example, the first pump 182 maintains a pressure within the process chamber less than 50 mTorr during a cleaning process. In another example, the first pump 182 maintains a pressure within the process chamber of about 0.5 mTorr to about 10 Torr.

The second pump 184 is one a turbo pump and a cryogenic pump. The second pump 184 is utilized during a deposition process. The second pump 184 is generally configured to operate a relatively lower volumetric flow rate and/or pressure. For example, the second pump 184 is configured to maintain the process volume 160 of the process chamber at a pressure of less than about 50 mTorr. In another example, the second pump 184 maintains a pressure within the process chamber of about 0.5 mTorr to about 10 mTorr. The reduced pressure of the process volume 160 maintained during deposition facilitates deposition of a film having reduced neutral stress and/or increased sp2-sp3 conversion, when depositing carbon-based hardmasks. Thus, process chamber 100 is configured to use both relatively lower pressure to improve deposition and relatively higher pressure to improve cleaning.

In some embodiments, which can be combined with other embodiments described herein, both of the first pump 182 and the second pump 184 are utilized during a deposition process to maintain the process volume 160 of the process chamber at a pressure of less than about 50 mTorr. In other embodiments, the first pump 182 and the second pump 184 maintain the process volume 160 at a pressure of about 0.5 mTorr to about 10 mTorr. A valve 186 is utilized to control the conductance path to one or both of the first pump 182 and the second pump 184. The valve 186 also provides symmetrical pumping from the process volume 160.

The process chamber 100 also includes a substrate transfer port 185. The substrate transfer port 185 is selectively sealed by an interior door 186A and an exterior door 186B. Each of the doors 186A and 186B are coupled to actuators 188 (i.e., a door actuator). The doors 186A and 186B facilitate vacuum sealing of the process volume 160. The doors 186A and 186B also provide symmetrical RF application and/or plasma symmetry within the process volume 160. Seals 116, such as O-rings, disposed at the interface of the spacer 194 and the chamber body 192 further seals the process volume 160. A controller 194 coupled to the process chamber 100 is configured to control aspects of the process chamber 100 during processing.

Figure 2:
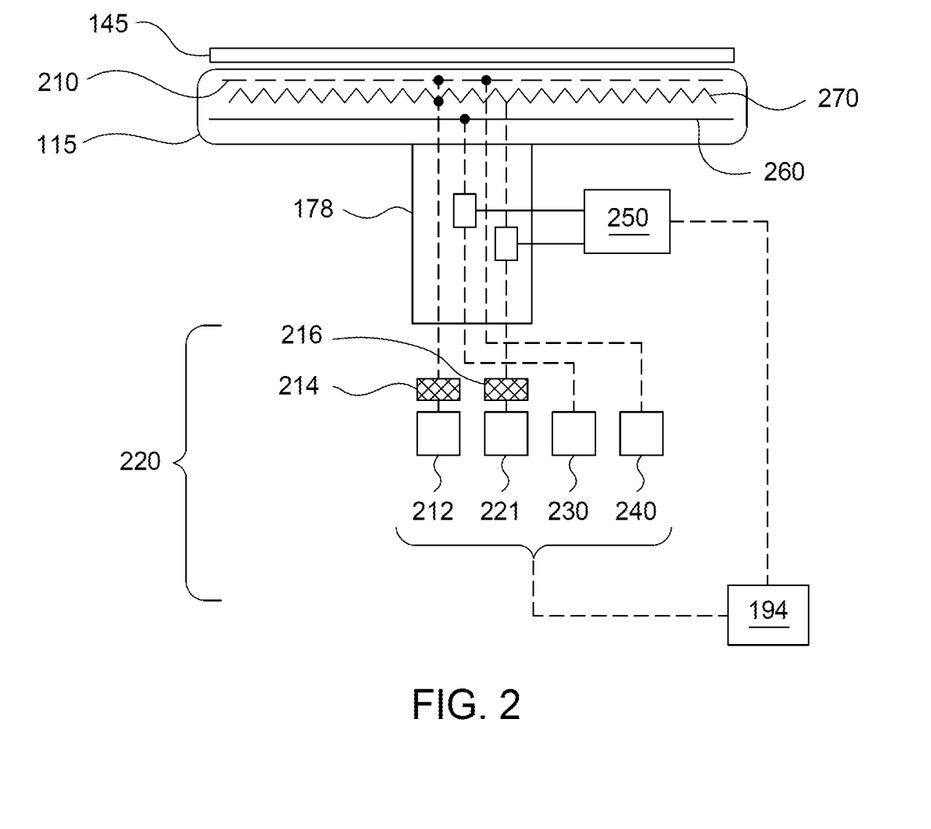
FIG. 2 depicts a schematic cross-sectional view of a substrate support according to an embodiment.

FIG. 2 depicts a schematic cross-sectional view of the substrate support 115 used in the processing systems of FIG. 1. The substrate support 115 includes a heater element 270 suitable for controlling the temperature of a substrate 145 supported on an upper surface of the substrate support 115. The heater element 270 is embedded in the substrate support 115. The substrate support 115 is resistively heated by applying an electric current from a heater power source 221 to the heater element 270. The heater power source 221 is coupled through an RF filter 216. The RF filter 216 is used to protect the heater power source 221 from RF energy. The heater element 270 is made of a nickel-chromium wire encapsulated in a nickel-iron-chromium alloy (e.g., INCOLOY® alloy) sheath tube. The electric current supplied from the heater power source 221 is regulated by the controller 194 to control the heat generated by the heater element 270, thus maintaining the substrate 145 and the substrate support 115 at a substantially constant temperature during film deposition. The supplied electric current is adjusted to selectively control the temperature of the substrate support 115 to be about −50° C. to about 600° C.

The substrate support 115 includes a chucking electrode 210, which is a mesh of a conductive material. The chucking electrode 210 is embedded in the substrate support 115. The chucking electrode 210 is coupled to a chucking power source 212 that, when energized, electrostatically clamps the substrate 145 to the upper surface of the substrate support 115.

The chucking electrode 210 is coupled through an RF filter 214 to the chucking power source 212, which provides direct current (DC) power to electrostatically secure the substrate 145 to the upper surface of the substrate support 115.

A power application system 220 is coupled to the substrate support 115. The power application system 220 includes the heater power source 221, the chucking power source 212, a first radio frequency (RF) power source 230, and a second RF power source 240. The power application system 220 includes the controller 194, and a sensor device 250 that is in communication with the controller 194 and both of the first RF power source 230 and the second RF power source 240. In some embodiments, the controller 194 is used to control the plasma from the processing gas by application of RF power from the first RF power source 230 and the second RF power source 240 in order to deposit a layer of material on the substrate 145.

The substrate support 115 also includes a second RF electrode 260, and together with the chucking electrode 210, applies RF power to tune the plasma. The first RF power source 230 is coupled to the second RF electrode 260 while the second RF power source 240 is coupled to the chucking electrode 210. A first matching network and a second matching network is provided for the first RF power source 230 and the second RF power source 240, respectively.

The first RF power source 230 and the second RF power source 240 produces power at the same frequency or a different frequency. In one or more embodiments, one or both of the first RF power source 230 and the second RF power source 240 independently produces power at a frequency from about 350 KHz to about 100 MHz (e.g., 350 KHz, 2 MHz, 13.56 MHz, 27 MHz, 40 MHz, 60 MHz, or 100 MHz). In one or more embodiments, the first RF power source 230 produces power at a frequency of 13.56 MHz and the second RF power source 240 produces power at a frequency of 2 MHz, or vice versa. RF power from one or both of the first RF power source 230 and second RF power source 240 is varied in order to tune the plasma. For example, the sensor device 250 is used to monitor the RF energy from one or both of the first RF power source 230 and the second RF power source 240. Data from the sensor device 250 is communicated to the controller 194, and the controller 194 is utilized to vary power applied by the first RF power source 230 and the second RF power source 240.

In one or more embodiments, the substrate support 115 has the chucking electrode 210 and an RF electrode separate from each other, and the first RF bias can be applied to the RF electrode 260 and the second RF bias can be applied to the chucking electrode 210. In one or more examples, the first RF bias is provided at a power of about 10 watts to about 3,000 watts at a frequency of about 350 KHz to about 100 MHz and the second RF bias is provided at a power of about 10 watts to about 3,000 watts at a frequency of about 350 KHz to about 100 MHz. In other examples, the first RF bias is provided at a power of about 2,500 watts to about 3,000 watts at a frequency of about 13.56 MHz and the second RF bias is provided at a power of about 800 watts to about 1,200 watts at a frequency of about 2 MHz.

In one or more embodiments, a deposition gas containing one or more hydrocarbon compounds and one or more dopant compounds is flowed or otherwise introduced into the process volume of the process chamber, such as a PE-CVD chamber. The hydrocarbon compound and the dopant compound is independently flowed or introduced into the process volume. In some examples, one or more substrates are positioned on a substrate support in the process chamber. The substrate support can have a chucking electrode and an RF electrode separate from each other. A plasma is ignited or otherwise generated at or near the substrate (e.g., substrate level) by applying a first RF bias to the RF electrode and a second RF bias to the chucking electrode. The doped diamond-like carbon film is deposited or otherwise formed on the substrate. In some embodiments, a patterned photoresist layer is deposited or otherwise formed over the doped diamond-like carbon film, the doped diamond-like carbon film is etched or otherwise formed in a pattern corresponding with the patterned photoresist layer, and the pattern is etched or otherwise formed into the substrate.

Carbon-Film Deposition Process

Figure 3:
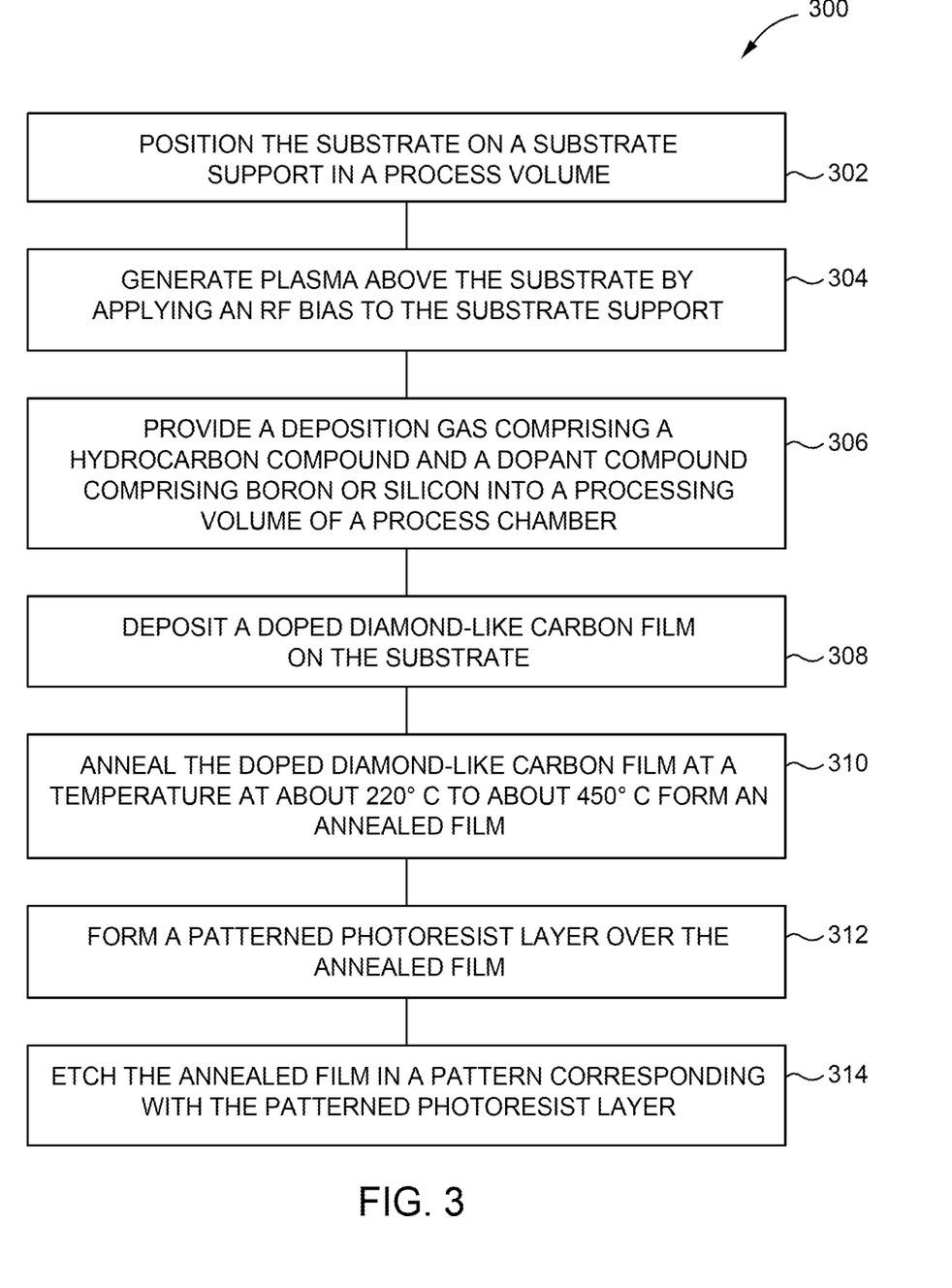
FIG. 3 depicts a flow diagram of a method of using a doped diamond-like carbon film according to an embodiment.
Figure 4A:
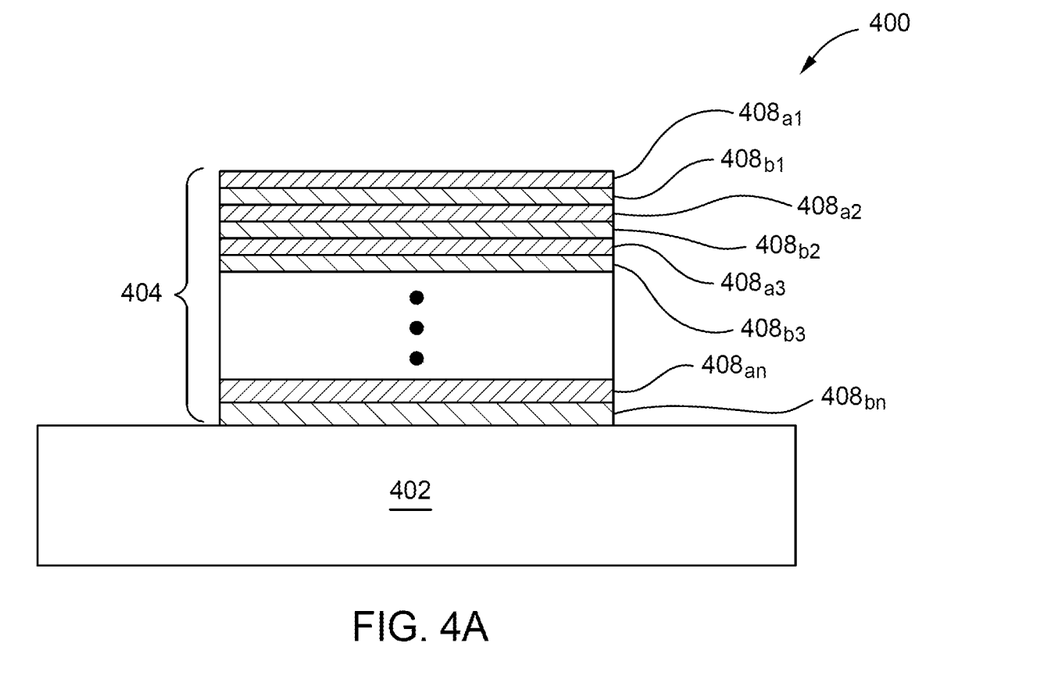
FIG. 4A a film stack formed on a substrate according to an embodiment.
Figure 4B:
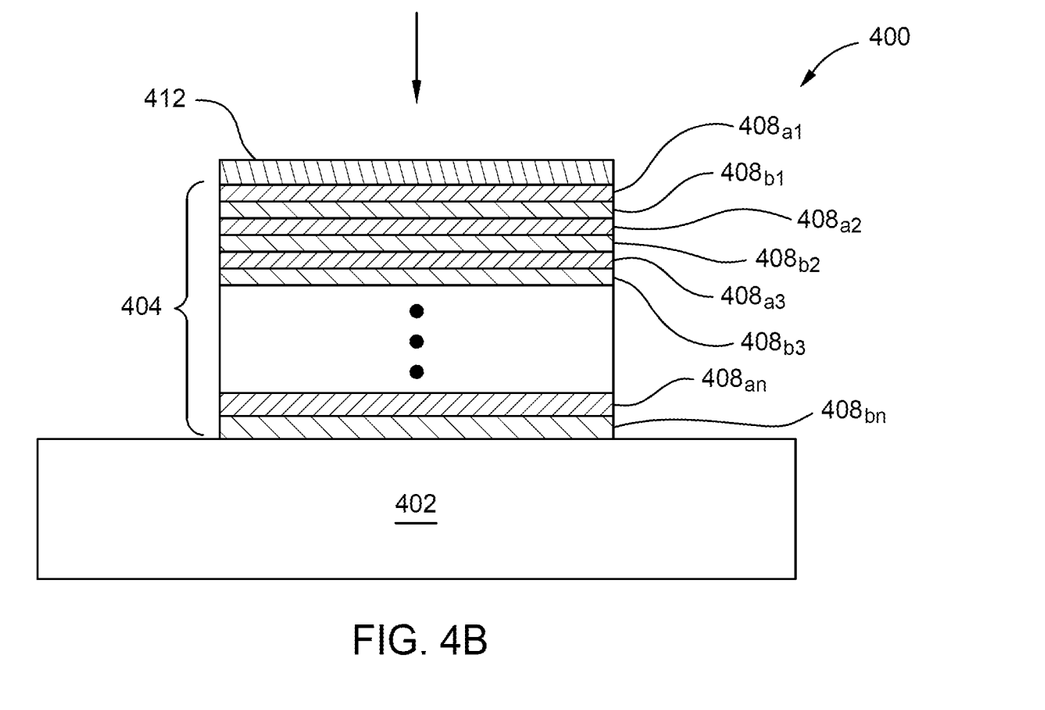
FIG. 4B depicts a doped diamond-like carbon film formed according to an embodiment.

FIG. 3 depicts a flow diagram of a method 300 for forming a doped diamond-like carbon film on a film stack disposed on a substrate in accordance with one embodiment of the present disclosure. The doped diamond-like carbon film formed on a film stack is utilized, for example, as a hardmask to form stair-like structures in the film stack. FIGS. 4A-4B are schematic cross-sectional views illustrating a sequence for forming a doped diamond-like carbon film on a film stack disposed on a substrate according to the method 300.

At activity 302, the substrate, such as substrate 402 depicted in FIG. 4A is positioned on a substrate support in a process volume of a process chamber, such as the process chamber 100 depicted in FIG. 1. The substrate 402 is substrate 145 depicted in FIG. 1 and FIG. 2. The substrate 402 is a silicon-based material or any suitable insulating material or conductive material as needed, having a film stack 404 disposed on the substrate 402 that form a structure 400, such as stair-like structures, in the film stack 404.

As shown in the embodiment depicted in FIG. 4A, the substrate 402 has a substantially planar surface, an uneven surface, or a substantially planar surface having a structure formed thereon. The film stack 404 is formed on the substrate 402. In one or more embodiments, the film stack 404 is to form a gate structure, a contact structure or an interconnection structure in a front end or back end process. The method 300 is performed on the film stack 404 to form the stair-like structures therein used in a memory structure, such as NAND structure. In one or more embodiments, the substrate 402 is a material such as crystalline silicon (e.g., Si<100> or Si<111>), silicon oxide, strained silicon, silicon germanium, doped or undoped polysilicon, doped or undoped silicon substrates and patterned or non-patterned substrates silicon on insulator (SOI), carbon doped silicon oxides, silicon nitride, doped silicon, germanium, gallium arsenide, glass, sapphire. The substrate 402 may have various dimensions, such as 200 mm, 300 mm, 450 mm, or other diameter substrates, as well as, rectangular or square panels. Unless otherwise noted, embodiments and examples described herein are conducted on substrates with a 200 mm diameter, a 300 mm diameter, or a 450 mm diameter substrate. In the embodiment wherein a SOI structure is utilized for the substrate 402, the substrate 402 includes a buried dielectric layer disposed on a silicon crystalline substrate. In one or more embodiments depicted herein, the substrate 402 is a crystalline silicon substrate.

In one or more embodiments, the film stack 404 disposed on the substrate 402 may have a number of vertically stacked layers. The film stack 404 may comprise pairs including a first layer (shown as $408a_1$, $408a_2$, $408a_3$, ..., $408a_n$) and a second layer (shown as $408b_1$, $408b_2$, $408b_3$, ..., $408b_n$) repeatedly formed in the film stack 404. The pairs includes alternating first layer (shown as $408a_1$, $408a_2$, $408a_3$, ..., $408a_n$) and second layer (shown as $408b_1$, $408b_2$, $408b_3$, ..., $408b_n$) repeatedly formed until desired numbers of pairs of the first layers and the second layers are reached.

The film stack 404 may be a part of a semiconductor chip, such as a three-dimensional memory chip Although three repeating layers of first layers (shown as $408a_1$, $408a_2$, $408a_3$, ..., $408a_n$) and second layers (shown as $408b_1$, $408b_2$, $408b_3$, ..., $408b_n$) are shown in FIGS. 4A-4B, it is noted that any desired number of repeating pairs of the first and the second layers may be utilized as needed.

In one or more embodiments, the film stack 404 forms multiple gate structures for a three-dimensional memory chip. The first layers $408a_1$, $408a_2$, $408a_3$, ..., $408a_n$, formed in the film stack 404 may be a first dielectric layer and the second layers $408b_1$, $408b_2$, $408b_3$, ..., $408b_n$ may be a second dielectric layer. Suitable dielectric layers may be utilized to form the first layers $408a_1$, $408a_2$, $408a_3$, ..., $408a_n$ and the second layer $408b_1$, $408b_2$, $408b_3$, ..., $408b_n$ include silicon oxide, silicon nitride, silicon oxynitride, silicon carbide, silicon oxycarbide, titanium nitride, composite of oxide and nitride, at least one or more oxide layers sandwiching a nitride layer, and combinations thereof, among others. In one or more embodiments, the dielectric layers may be a high-k material having a dielectric constant greater than 4. Suitable examples of the high-k materials include hafnium oxide, zirconium oxide, titanium oxide, hafnium silicon oxide or hafnium silicate, hafnium aluminum oxide or hafnium aluminate, zirconium silicon oxide or zirconium silicate, tantalum oxide, aluminum oxide, aluminum doped hafnium dioxide, bismuth strontium titanium (BST), and platinum zirconium titanium (PZT), dopants thereof, or any combination thereof.

In one or more examples, the first layers $408a_1$, $408a_2$, $408a_3$, ..., $408a_n$ are silicon oxide layers and the second layers $408b_1$, $408b_2$, $408b_3$, ..., $408b_n$ are silicon nitride layers or polysilicon layers disposed on the first layers $408a_1$, $408a_2$, $408a_3$, $408a_n$. In one or more embodiments, the thickness of first layers $408a_1$, $408a_2$, $408a_3$, $408a_n$ may be controlled to be about 50 Å to about 1,000 Å, such as about 500 Å, and the thickness of the each second layers $408b_1$, $408b_2$, $408b_3$, $408b_n$ may be controlled to be about 50 Å to about 1,000 Å, such as about 500 Å. The film stack 404 may have a total thickness of about 100 Å to about 2,000 Å. In one or more embodiments, a total thickness of the film stack 404 is about 3 microns to about 10 microns and can vary as technology advances.

It is noted that the doped diamond-like carbon film may be formed on any surfaces or any portion of the substrate 402 with or without the film stack 404 present on the substrate 402. In some embodiments, a chucking voltage is supplied to the substrate support to retain the substrate thereon.

At activity 304, a plasma is generated above the substrate by applying an RF bias to the substrate support. In some embodiments one or more RF biases is applied to the substrate support. The first RF bias is applied with a power of about 10 watts to about 3,000 watts at a frequency of about 350 KHz to about 100 MHz (e.g., about 350 KHz, about 2 MHz, about 13.56 MHz, about 27 MHz, about 40 MHz, about 60 MHz, or about 100 MHz). In one or more embodiments, the first RF bias is provided at a power of about 2,500 watts to about 3,000 watts at a frequency of about 13.56 MHz. In one or more embodiments, the first RF bias is provided to the substrate support 115 via the second RF electrode 260. The second RF electrode 260 may be in electronic communication with the first RF power source 230 that supplies a biasing voltage to the second RF electrode 260. In one or more embodiments, the bias power is about 10 watts to about 3,000 watts, about 2,000 watts to about 3,000 watts, or about 2,500 watts to about 3,000 watts. The first RF power source 230 may produce power at a frequency of about 350 KHz to about 100 MHz (e.g., about 350 KHz, about 2 MHz, about 13.56 MHz, about 27 MHz, about 40 MHz, about 60 MHz, or about 100 MHz).

In one or more embodiments, activity 304 further includes applying a second RF bias to the substrate support. The second RF bias is applied at about 10 watts to about 3,000 watts at a frequency of about 350 KHz to about 100 MHz (e.g., about 350 KHz, about 2 MHz, about 13.56 MHz, about 27 MHz, about 40 MHz, about 60 MHz, or about 100 MHz). In some examples, the second RF bias is provided at a power of about 800 watts to about 1,200 watts at a frequency of about 2 MHz. In other examples, the second RF bias is provided to the substrate 402 via the chucking electrode 210. The chucking electrode 210 may be in electronic communication with second RF power source 240 that supplies a biasing voltage to the chucking electrode 210. In one or more examples, the bias power is about 10 watts to about 3,000 watts, about 500 watts to about 1,500 watts, or about 800 watts to about 1,200 watts. The second RF power source 240 may produce power at a frequency of about 350 KHz to about 100 MHz (e.g., about 350 KHz, about 2 MHz, about 13.56 MHz, about 27 MHz, about 40 MHz, about 60 MHz, or about 100 MHz). In one or more embodiments, the chucking voltage supplied in activity 302 is maintained during activity 304.

In some embodiments, the first RF bias is provided to the substrate 402 via the chucking electrode 210 and the second RF bias may be provided to the substrate 402 via the second RF electrode 260. In one or more examples, the first RF bias is about 2,500 watts (about 13.56 MHz) and the second RF bias is about 1,000 watts (about 2 MHz).

During activity 306, a deposition gas is flowed into the process volume 160 to form the doped diamond-like carbon film on the film stack. The deposition gas contains one or more hydrocarbon compounds and one or more dopant compounds. The hydrocarbon compound can be or include one, two, or more one hydrocarbon compounds in any state of matter. Similarly, the dopant compound can be or include one, two, or more one dopant compounds in any state of matter.

In one or more embodiments, the hydrocarbon compound is a gaseous hydrocarbon or a liquid hydrocarbon. The hydrocarbon can be or include one or more alkanes, one or more alkenes, one or more alkynes, one or more aromatic, or any combination thereof. In some examples, the hydrocarbon compound has a general formula $C_xH_y$, where x has a range of 1 to about 20 and y has a range of 1 to about 20. Suitable hydrocarbon compounds include, for example, $C_2H_2$, $C_3H_6$, $CH_4$, $C_4H_8$, 1,3-dimethyladamantane, bicyclo [2.2.1]hepta-2,5-diene (2,5-norbornadiene), adamantine ($C_{10}H_{16}$), norbornene ($C_7H_{10}$), or any combination thereof. In one or more examples, ethyne is used due to formation of more stable intermediate species, which allows more surface mobility.

The hydrocarbon compound can be or include one or more alkanes (e.g., $C_nH_{2n+2}$, wherein n is from 1 to 20). Suitable hydrocarbon compounds include, for example, alkanes such as methane ($CH_4$), ethane ($C_2H_6$), propane ($C_3H_8$), butane ($C_4H_{10}$) and its isomer isobutane, pentane ($C_5H_{12}$), hexane ($C_6H_{14}$) and its isomers isopentane and neopentane, hexane ($C_6H_{14}$) and its isomers 2-methylpentane, 3-methylpentane, 2,3-dimethylbutane, and 2,2-dimethyl butane, or any combination thereof.

The hydrocarbon compound can be or include one or more alkenes (e.g., $C_nH_{2n+2}$, wherein n is from 1 to 20). Suitable hydrocarbon compounds include, for example, alkenes such as ethylene, propylene ($C_3H_6$), butylene and its isomers, pentene and its isomers, and the like, dienes such as butadiene, isoprene, pentadiene, hexadiene, or any combination thereof. Additional suitable hydrocarbons include, for example, halogenated alkenes such as monofluoroethylene, difluoroethylenes, trifluoroethylene, tetrafluoroethylene, monochloroethylene, dichloroethylenes, trichloroethylene, tetrachloroethylene, or any combination thereof.

The hydrocarbon compound can be or include one or more alkynes (e.g., $C_nH_{2n-2}$, wherein n is from 1 to 20). Suitable hydrocarbon compounds include, for example, alkynes such as ethyne or acetylene ($C_2H_2$), propyne ($C_3H_4$), butylene ($C_4H_8$), vinylacetylene, or any combination thereof.

The hydrocarbon compound can be or include one or more aromatic hydrocarbon compounds, such as benzene, styrene, toluene, xylene, ethylbenzene, acetophenone, methyl benzoate, phenyl acetate, phenol, cresol, furan, and the like, alpha-terpinene, cymene, 1,1,3,3,-tetramethylbutylbenzene, t-butylether, t-butylethylene, methyl-methacrylate, and t-butylfurfurylether, compounds having the formula $C_3H_2$ and $C_5H_4$, halogenated aromatic compounds including monofluorobenzene, difluorobenzenes, tetrafluorobenzenes, hexafluorobenzene, or any combination thereof.

Exemplary silicon precursors can be or include silane, disilane, trisilane, tetrasilane, pentasilane, hexasilane, monochlorosilane, dichlorosilane, trichlorosilane, tetrachlorosilane, hexachlorosilane, substituted silanes, plasma derivatives thereof, or any combination thereof. Exemplary boron precursors can be or include diborane, triborane, tetraborane, triethylborane (Et3B), dimethylamino borane, or any combination thereof.

In one or more embodiments, the deposition gas further contains one or more dilution gases, one or more carrier gases, and/or one or more purge gases. Suitable dilution gases, carrier gases, and/or purge gases such as helium (He), argon (Ar), xenon (Xe), hydrogen ($H_2$), nitrogen ($N_2$), ammonia ($NH_3$), nitric oxide (NO), or any combination thereof, among others, may be co-flowed or otherwise supplied with the deposition gas into the process volume 160. Argon, helium, and/or nitrogen can be used to control the density and deposition rate of the doped diamond-like carbon film. In some cases, the addition of $N_2$ and/or $NH_3$ can be used to control the hydrogen ratio of the doped diamond-like carbon film, as discussed below. Alternatively, dilution gases may not be used during the deposition.

In some embodiments, the deposition gas further contains an etchant gas. Suitable etchant gases can be or include chlorine ($C_{12}$), fluorine ($F_2$), hydrogen fluoride (HF), carbon tetrafluoride ($CF_4$), nitrogen trifluoride ($NF_3$), or any combination thereof. Not to be bound by theory, but it is believed that the etchant gases selectively etch $sp^2$ hybridized carbon atoms from the film thus increasing the fraction of spa hybridized carbon atoms in the film, which increases the etch selectivity of the film.

In activity 308, a doped diamond-like carbon film is deposited on the substrate. The substrate temperature is about -50° C. to about 650° C., such as about 10° C. to about 600° C., such as about 300° C. to about 550° C. The chamber pressure is about 0.5 mTorr to about 10 Torr (e.g., about 2 mTorr to about 50 mTorr; or about 2 mTorr to about 10 mTorr). The flow rate of the hydrocarbon compound is about 10 sccm to about 1,000 sccm (e.g., about 100 sccm to about 200 sccm or about 150 sccm to about 200 sccm). The flow rate of the dopant compound is about 1 sccm to about 500 sccm (e.g., about 10 sccm to about 150 sccm or about 20 sccm to about 100 sccm, such as about 40 sccm to about 60 sccm). The flow rate of a dilution gas or purge gas is about 50 sccm to about 50,000 sccm (e.g., about 50 sccm to about 500 sccm; or about 50 sccm to about 100 sccm). Table 1 below depicts process conditions for an example method of the present disclosure.

TABLE 1

| Deposition Parameter | Exemplary Range | Exemplary Range | Exemplary Range |
| --- | --- | --- | --- |
| Temperature (° C.) | −50-350° C. | 10-100° C. | 10-50° C. |
| Pressure (Torr) | 0.5 mTorr-10 Torr | 2 mTorr-50 mTorr | 2 mTorr-10 mTorr |
| First RF Power (13.56 MHz) | 100-3,000 watts | 2,000-3,000 watts | 2,500 watts |
| Second RF Power (2 MHz) | 200-2,000 watts | 800-1,200 watts | 1,000 watts |
| Spacing | 1,000 to 15,000 mils | 6,000 to 12,000 mils | 8,000 to 12,000 mils |
| $C_2H_2$ flow | 10-1,000 sccm | 100-200 sccm | 150 sccm |
| $B_2H_2$ (in $H_2$) flow or $SiH_4$ flow | 1-500 sccm | 10-150 sccm | 50 sccm for $B_2H_2$ (in $H_2$) OR 20 sccm for $SiH_4$ |
| He flow | 50-5,000 sccm | 50-100 sccm | 100 sccm |

The doped diamond-like carbon film is deposited to a thickness of about 5 Å and about 20,000 Å (e.g., about 300 Å to about 5,000 Å; about 2,000 Å and about 3,000 A, or about 5 Å to about 200 Å). The above process parameters depicted in Table I provide examples of process parameters for a 300 mm substrate in a deposition chamber, such as the chamber depicted in FIG. 1.

In some embodiments, the doped diamond-like carbon film includes about 5 at. % to about 25 at. % of dopant, such as about 5 at. % to about 10 at. %, or about 15 at. % to about 20 at. %, or about 8 at. % to about 15 at. % of dopant. In some embodiments, the doped diamond-like carbon film has a density of about 1.5 g/cc to about 3.0 g/cc, such as about 2.0 g/cc to about 2.8 g/cc. Without being bound by theory, it is believed that doping the carbon film at concentrations lower than the concentration disclosed herein provides little to no increase in thermal stability. Additionally, doping at concentrations above the concentrations disclosed herein reduces film modulus and etch selectivity of the resulting film. It has been discovered that the claimed dopant concentration enables enhanced thermal stability while maintaining carbon film properties, such as film modulus and etch selectivity.

The doped diamond-like carbon film has a first stress property (MPa) less than −100 MPa, such as about −1100 MPa to about −500 MPa, such as about −750 MPa to about −600 MPa. The doped diamond-like carbon film has a density (g/cc) of greater than 1.5 g/cc, for example about 2 g/cc or greater, such as about 2.8 g/cc to about 3.0 g/cc. The doped diamond-like carbon film has an elastic modulus (GPa) of greater than 75 GPa, for example, from about 100 GPa to about 175 GPa.

In activity 310, the doped diamond-like carbon film is annealed at a temperature of about 220° C. to about 450° C. In some embodiments, the doped diamond-like carbon film is annealed in the same process volume 160. Alternatively, the doped diamond-like carbon film is annealed in a second process chamber, such as a furnace. The doped diamond-like carbon film is annealed for about 1 minute to about 1 hour, such as about 5 minutes to about 30 minutes, such as about 10 minutes to about 20 minutes. The etch selectivity of the annealed doped diamond-like carbon film is about 0.9 to about 1.3. The annealed doped diamond-like carbon film includes a second stress property. The second stress property having an absolute value less than or within 10% the first stress property of the doped diamond-like carbon film prior to annealing. In some embodiments, the second stress property has an absolute value less than the first stress property. In some embodiments, stress properties are tested by measuring substrate bow using optical metrology methods. In some embodiments, the annealed film includes about 50 at. % to about 80 at. %, such as about 60 at. % to about 70 at. % of spa hybridized carbon atoms.

In some embodiments, the annealed doped diamond-like carbon film has an etch selectivity substantially the same or greater than the etch selectivity of the doped diamond-like carbon film prior to annealing. In some embodiments, the annealed doped diamond-like carbon film has modulus substantially the same as the doped diamond-like carbon film prior to annealing.

In activity 312, a patterned photoresist is formed over the annealed film and in activity 314, the annealed film is etched in a pattern corresponding with the patterned photoresist layer.

EXAMPLES

Figure 5:
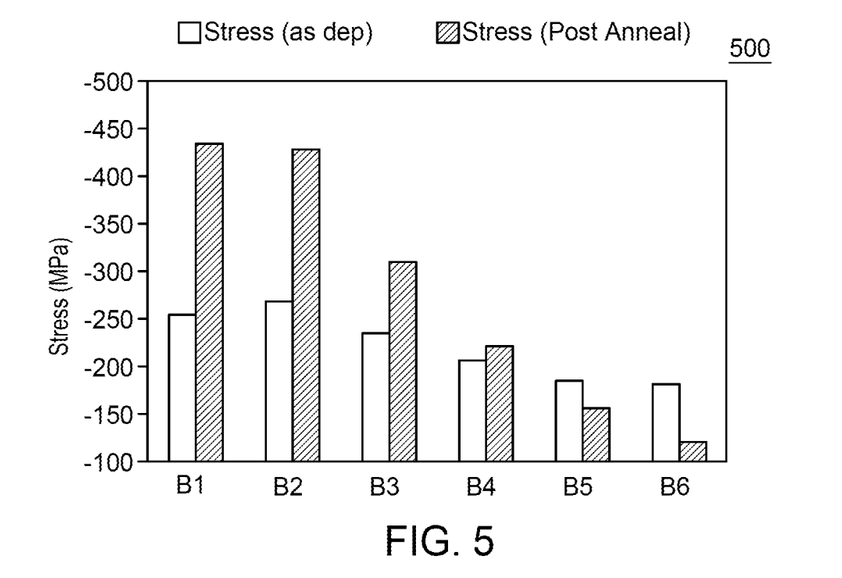
FIG. 5 depicts a comparative graphical representation of stress results for boron doped and undoped diamond-like carbon films before and after annealing.

FIG. 5 depicts a graphical representation 500 of two comparative samples of diamond-like carbon films that do not include dopants (e.g., B1, B2) and four samples including diamond-like carbon films doped with boron (e.g., B3, B4, B5, B6). The four samples are arranged from lowest doping concentration to highest doping concentration, with B3 having the lowest boron concentration and B6 having the highest. Each of the samples were tested for stress properties before and after thermal annealing, such as the annealing described herein. Each of the comparative samples showed an increase in absolute stress values (e.g., decrease in stress values). The boron doped samples with the two lowest concentrations of boron also showed an increase in absolute stress value. However, the increase was reduced relative to the undoped samples, showing better thermal stability. The remaining doped samples all showed a reduction in absolute stress values after annealing. All of the doped samples substantially maintained the similar modulus values and etch selectivity relative to the undoped samples. Without being bound by theory, it is believed that annealing pure carbon film leads to conversion of carbon-carbon single bonds (C—C) to reduced carbon-carbon double bonds (C═C). Providing dopants such as silicon prevents formation of double bonds that would otherwise occur between carbon atoms since silicon and carbon atoms cannot form silicon to carbon double bonds (Si═C). The dopants such as silicon and boron provides enhanced thermal stability after annealing conditions.

Figure 6:
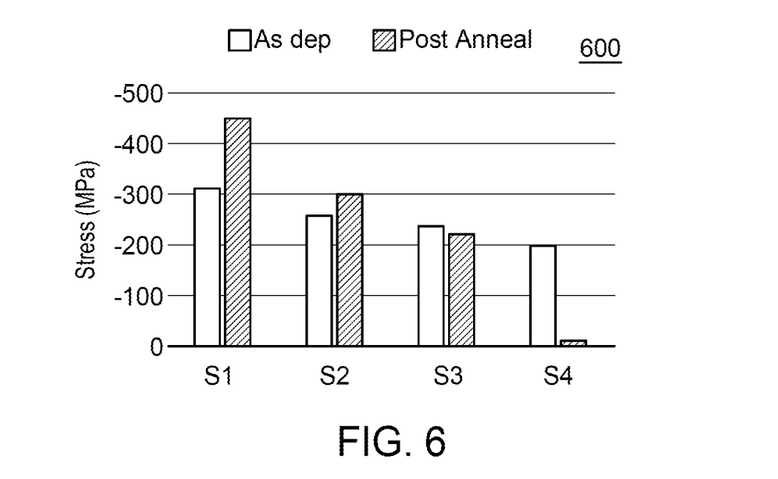
FIG. 6 depicts a comparative graphical representation of stress results for silicon doped and undoped diamond-like carbon films before and after annealing.

Similarly, FIG. 6 depicts a graphical representation 600 of an undoped diamond-like carbon film sample (e.g., S1) before and after annealing and three silicon doped diamond-like carbon film (e.g., S2, S3, S4). The three samples are arranged from lowest doping concentration to highest doping concentration, with S2 having the lowest silicon dopant concentration and S4 having the highest. Each of the samples were tested for stress properties before and after thermal annealing, such as the annealing described herein. The undoped samples showed increased absolute stress results after annealing. The silicon doped sample S2 having the lowest concentration of silicon also showed an increase in absolute stress, but to a lesser magnitude as the undoped sample. The remaining samples each showed a decrease in absolute stress values. All of the doped samples substantially maintained the similar modulus values and etch selectivity relative to the undoped samples. The silicon doped samples showed increased modulus relative to the boron doped samples. The boron doped samples showed increased etch selectivity relative to the silicon doped samples. Without being bound by theory, it is believed that the silicon dopants in the samples are potentially bonded to the carbon in the film. Carbon-silicon bonds are believed to demonstrate increased modulus relative to carbon bonds within films that are free of silicon dopants.

Table 2 depicts physical properties of samples such as the samples depicted in FIG. 5 and FIG. 6. As shown below, samples having low concentrations of dopants show enhanced thermal stability relative to undoped samples, which is demonstrated by the reduced change in stress results after annealing the samples. Samples with higher concentrations of dopant demonstrated an even greater demonstration of thermal stability as absolute stress values were further reduced after annealing relative to as deposited samples with the dopants. Etch selectivity was also measured post anneal and the range for etch selectivity was maintained within a range of about 0.9% to about 1.4% across all samples.

TABLE 2

| Exemplary Sample Nos. | Composition | Exemplary Stress Range As Deposited | Exemplary Stress Range Post Anneal at 300° C. for 5 minutes | Modulus Post Anneal |
|---|---|---|---|---|
| B1, B2, S1 | Comparative (zero dopants) | −310 MPa to −250 MPa | −450 MPa to −400 MPa | 140 GPa to 180 GPa |
| B3, B4 | Greater than 0 to 11 at. % Boron Dopant | −250 MPa to −200 MPa | −320 MPa to −200 MPa | 100 GPa to 150 GPa |
| B5, B6 | Greater than 11 at. % to 25 at. % Boron Dopant | −200 MPa to −150 MPa | −175 MPa to −120 MPa | 70 GPa to 110 GPa |
| S2 | Greater than 0 to 7 at. % Silicon Dopant | −275 MPa to −225 MPa | −310 MPa to −280 MPa | 140 GPa to 180 GPa |
| S3, S4 | Greater than 7 at. % to 25 at. % Silicon Dopant | −225 MPa to −175 MPa | −220 MPa to −5 MPa | 140 GPa to 180 GPa |

In summation, a process is provided herein that includes doping diamond-like carbon films with either silicon or boron dopants. The diamond-like carbon film is further annealed to produce a film with good thermal stability. The process described herein enhances thermal stability while minimizing impact on other properties such as modulus and etch selectivity.

What is claimed is:

1. A method of processing a substrate, comprising:
   flowing a deposition gas comprising a hydrocarbon compound and a dopant compound into a process volume of a process chamber having a substrate positioned on a substrate support, wherein the process volume is maintained at a pressure of about 0.5 mTorr to about 10 mTorr;
   generating a plasma at the substrate by applying a first RF bias to the substrate support to deposit a doped diamond-like carbon film on the substrate, the doped diamond-like carbon film comprising about 5 at. % to about 25 at. % of dopant, the doped diamond-like carbon film having a first stress property; and
   annealing the doped diamond-like carbon film at about 220° C. to about 450° C. to form an annealed film, the annealed film having a second stress property, the second stress property having an absolute value that is less than or within 10% of an absolute value of the first stress property.

2. The method of claim 1, wherein the annealed film has a density of about 2.0 g/cc to about 3.0 g/cc.

3. The method of claim 1, wherein the dopant compound comprises boron, silicon, or both.

4. The method of claim 1, wherein the dopant compound comprises disilane, diborane, triethylborane, silane, disilane, trisilane, abducts thereof, or any combination thereof.

5. The method of claim 1, wherein the doped diamond-like carbon film comprises about 8 at. % to about 15 at. % of dopant.

6. The method of claim 1, wherein the annealed film comprises about 50 at. % to about 80 at. % of sp$^3$ hybridized carbon atoms.

7. The method of claim 1, wherein the hydrocarbon compound comprises ethyne, propene, methane, butene, 1,3-dimethyladamantane, bicyclo [2.2.1] hepta-2,5-diene, adamantine, norbornene, or any combination thereof.

8. The method of claim 1, wherein the annealed film has a etch selectivity of about 0.9 to about 1.3.

9. The method of claim 1, wherein the process volume is maintained at a pressure of about 5 mTorr to about 10 mTorr, and wherein the substrate is maintained at a temperature of about 0° C. to about 50° C.

10. The method of claim 1, wherein the annealed film is a silicon doped annealed film and has an elastic modulus of greater than 150 GPa.

11. The method of claim 1, wherein generating the plasma at the substrate further comprises applying a second RF bias to the substrate support.

12. The method of claim 11, wherein the first RF bias is provided at a power of about 10 watts to about 3,000 watts at a frequency of about 350 KHz to about 100 MHz, and wherein the second RF bias is provided at a power of about 10 watts to about 3,000 watts at a frequency of about 350 KHz to about 100 MHz.

13. The method of claim 1, wherein the doped diamond-like carbon film is annealed for about 1 minute to about 30 minutes.

14. A method of processing a substrate, comprising:
   flowing a deposition gas comprising a hydrocarbon compound and a dopant compound comprising silicon into a process volume of a process chamber having a substrate positioned on a substrate support, wherein the substrate support has a chucking electrode and an RF electrode separate from the chucking electrode, wherein the process volume is maintained at a pressure of about 0.5 mTorr to about 10 Torr;
   generating a plasma at the substrate by applying a first RF bias to the RF electrode and a second RF bias to the chucking electrode to deposit a doped diamond-like carbon film on the substrate, wherein the doped diamond-like carbon film has a density of greater than 2 g/cc to about 12 g/cc and a first stress of about −300 MPa to about −150 MPa; and annealing the doped diamond-like carbon film at a temperature at about 220° C. to about 450° C. to form an annealed film, the annealed film having a second stress of about −250 MPa to about −100 MPa.

15. The method of claim 14, wherein the doped diamond-like carbon film has a density of about 3 g/cc to about 10 g/cc.

16. The method of claim 14, wherein the annealed film has a etch selectivity of about 0.9 to about 1.3.

17. The method of claim 14, wherein the doped diamond-like carbon film comprises about 8 at. % to about 15 at. % of dopant.

18. A method of processing a substrate, comprising:
positioning the substrate on a substrate support in a process volume;
generating plasma above the substrate by applying an RF bias to the substrate support;
providing a deposition gas comprising a hydrocarbon compound and a dopant compound comprising boron or silicon into a process volume of a process chamber, wherein the substrate support has a chucking electrode and an RF electrode separate from the chucking electrode, wherein the process volume is maintained at a pressure of about 0.5 mTorr to about 10 mTorr;
generating a plasma at the substrate by applying a first RF bias to the RF electrode and a second RF bias to the chucking electrode to deposit a doped diamond-like carbon film on the substrate, wherein the doped diamond-like carbon film has a density of greater than 2 g/cc to about 12 g/cc and a stress of about −600 MPa to about −300 MPa;
annealing the doped diamond-like carbon film at a temperature at about 220° C. to about 450° C. to form an annealed film, the annealed film having a second stress of about −250 MPa to about −100 MPa;
forming a patterned photoresist layer over the annealed film;
etching the annealed film in a pattern corresponding with the patterned photoresist layer; and
etching the pattern into the substrate.

19. The method of claim 18, wherein the doped diamond-like carbon film comprises about 8 at. % to about 15 at. % of dopant.

20. The method of claim 18, wherein the annealed film is an annealed silicon doped film and has an elastic modulus of greater than 150 GPa.

* * * * *